US007899192B2

United States Patent
Oxford et al.

(10) Patent No.: US 7,899,192 B2
(45) Date of Patent: Mar. 1, 2011

(54) METHOD FOR DYNAMICALLY ADJUSTING THE SPECTRAL CONTENT OF AN AUDIO SIGNAL

(76) Inventors: J. Craig Oxford, Nashville, TN (US); Patrick Taylor, Huntsville, AL (US); D. Michael Shields, St. Paul, MN (US)

( * ) Notice: Subject to any disclaimer, the term of this patent is extended or adjusted under 35 U.S.C. 154(b) by 1045 days.

(21) Appl. No.: 11/708,452

(22) Filed: Feb. 20, 2007

(65) Prior Publication Data

US 2007/0253563 A1    Nov. 1, 2007

Related U.S. Application Data

(63) Continuation-in-part of application No. 11/633,908, filed on Dec. 5, 2006.

(60) Provisional application No. 60/794,293, filed on Apr. 22, 2006.

(51) Int. Cl.
*H03G 3/00* (2006.01)
*H03G 5/00* (2006.01)
*G10L 19/00* (2006.01)

(52) U.S. Cl. .......................... 381/61; 381/98; 704/200.1

(58) Field of Classification Search .................... 381/61, 381/94.1–94.3, 98; 700/94; 704/200.1, 226–230
See application file for complete search history.

(56) References Cited

U.S. PATENT DOCUMENTS 5,930,373 A * 7/1999 Shashoua et al. ............... 381/98

\* cited by examiner

*Primary Examiner* — Vivian Chin
*Assistant Examiner* — Douglas J Suthers
(74) *Attorney, Agent, or Firm* — Wayne Edward Ramage; Baker Donelson

(57) ABSTRACT

A method for dynamically adjusting the spectral content of an audio signal, which increases the harmonic content of said audio signal, said method comprising translating an encoded digital signal into data bands, creating a psychoacoustic model to identify sections of said data bands that are deficient in harmonic quality, analyzing the fundamental frequency and amplitude of said harmonically deficient data bands, creating additional higher order harmonics for said harmonically deficient data bands, adding said higher order harmonics back to said encoded digital signal to form a newly enhanced signal, inverse filtering said newly enhanced signal, and converting said inverse filtered signal to an analog waveform for consumption by the listener.

2 Claims, 2 Drawing Sheets

METHOD FOR DYNAMICALLY ADJUSTING THE SPECTRAL CONTENT OF AN AUDIO SIGNAL

This application claims the benefit of provisional patent application Ser. No. 60/794,293, filed Apr. 22, 2006 by the present inventors. This application is a CIP of Ser. No. 11/633,908 filed Dec. 5, 2006 by the present inventors.

BACKGROUND OF THE INVENTION

1. Field of Invention

The present invention relates to a method for dynamically adjusting the spectral content of a digital audio signal wherein significant processing is performed to modify a signal's harmonic content 2. Background of the Invention Much audio is stored, distributed and processed in the digital domain. Regardless of this fact, the audio must ultimately be converted back to analog in order to be used. Many audio purists resist the digitization of audio, preferring pure analog sources such as LP recordings, which originate from analog master tapes. This is because of inherent defects in what are termed "lossy compression" and "lossless compression" in audio data compression. In both lossy and lossless compression, information redundancy is reduced, using methods such as coding, pattern recognition and linear prediction to reduce the amount of information used to describe the data. The idea behind lossy audio compression was to use psychoacoustics to recognize that not all data in an audio stream can be perceived by the human auditory system. Most lossy compression reduces perceptual redundancy by first identifying sounds which are considered perceptually insignificant. Typical examples include high frequencies, or sounds that occur at the same time as other louder sound, which are coded with decreased accuracy or not coded at all.

However, reducing perceptual redundancy often does not achieve sufficient compression for a particular application and requires further lossy compression with a difference in quality that is more readily perceived by the user. While the data reduction is again guided by some model of how important the sound is as perceived by the human ear, with the goal of efficiency and optimized quality for the target data rate, the use of lossy compression may result in a perceived reduction of the audio quality that ranges from none to severe.

Currently, data removed during lossy compression cannot be recovered by decompression. Additionally, audio quality is affected when a file is decompressed and recompressed (generational losses) which makes lossy compression unsuitable for storing the intermediate results in professional audio engineering applications but makes it very popular with end users (particularly MP3) since a megabyte can store almost a minute's worth of music at adequate quality.

Timbre or tone color is known in psychoacoustics as sound quality or sound color. Timbre has been called "the psychoacoustician's multidimensional wastebasket category" as it can denote many apparently unrelated aspects of sound. McAdams, S., and Bregman, A. "Hearing Musical Streams," *Comput. Music J*. It should be pointed out that the addition or restoration of harmonics will have the effect of sharpening the rise of the leading edge of transient signals, this is analogous to edge enhancement in video. It has been observed that the rendering of the leading edge of transient signals is a key element in the perception of tone color or timbre and in the rapid identification of sounds. Thus restoring the harmonics lost to audio compression also serves to restore timbre resulting in a higher quality listening experience.

While this method is obviously useful for compressed digital audio signals, it is also useful to enhance non-compressed digital audio signals. This will result in a richer timbre or tone color to the audio signal and an enhanced listening experience.

BRIEF DESCRIPTION OF THE INVENTION

Figure 1:
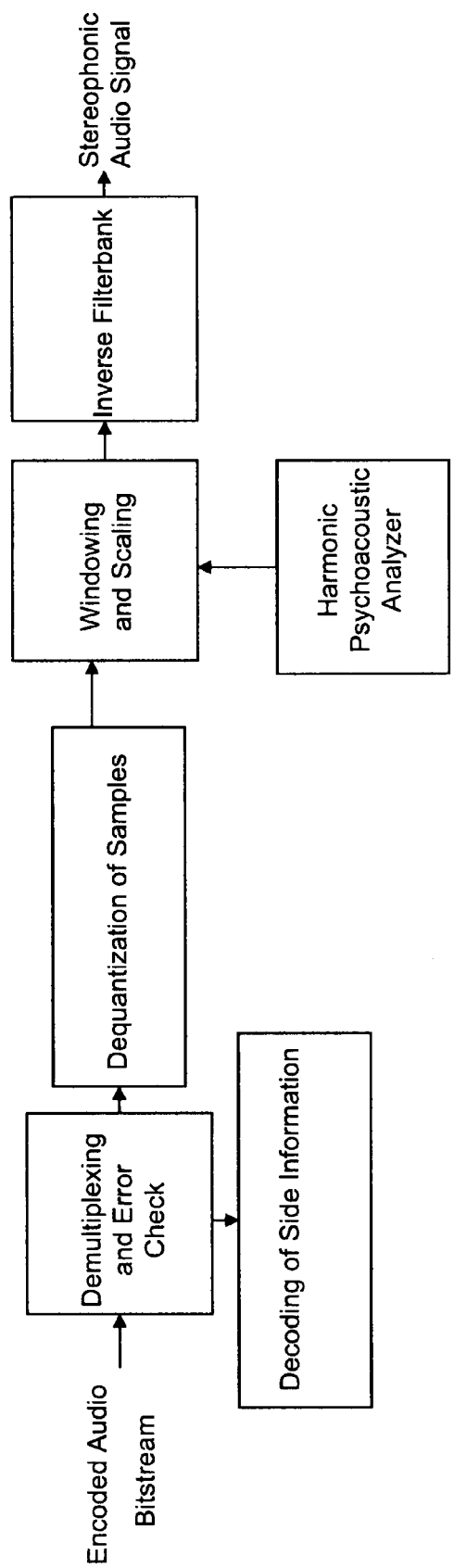
FIG. 1 represents a block diagram of the audio enhancement process.

The present invention seeks to restore the perceptual and emotional elements lost to technical process of audio processing. The present invention uses a psychoacoustic model to translate an encoded digital signal into data bands that are analyzed for harmonic significance. Then, a frequency analysis is performed and sections of sound that are deficient in harmonic quality are identified. The sections are analyzed for their fundamental frequency and amplitude. Additional signals of higher order harmonics for the sections are created and the higher order harmonics are added back to coded signal to form a newly enhanced signal which is inverse filtered and converted to an analog waveform for consumption by the listener.

DETAILED DESCRIPTION OF THE INVENTION

Common digital audio standards such as MPEG-1 (Layers I-III), MPEG-2, Microsoft Windows Media audio, PAC, ATRAC, and others use a variety of encoding techniques to quantize and produce digital representations of analog acoustic sources. The sampling and encoding of audio is performed according to complex psychoacoustic models of human auditory perception in conjunction with data reduction schemes to produce a coded audio signal which can be decoded with less sophisticated circuitry to produce a stereophonic audio signal. Limitations bandwidth and bit rate requirements for the storage and transmission of digital data dictate the use inherently lossy coding algorithms. The purpose of the psychoacoustic model is to take advantage of the fact that the human auditory system can detect sound information up to certain thresholds and the presence of certain sounds can influence the ability of the brain to detect and perceive other sounds. The overall amount of data can be reduced by not encoding the audio signals that would be masked from the perception of the listener. For this reason, this family of encoding schemes is referred to as perceptual encoding.

Perceptual coding commonly works by separating an incoming audio signal into groups of bands that are compared to the psychoacoustic model. Those signals that are above the auditory threshold are quantized and passed through the encoding chain. The signals below the masking threshold are discarded, and all information from those samples is destroyed. The net effect is a final audio signal that is representative of the original analog source but that is inherently incomplete. Some the information that is lost in the perceptual coding processes is the some of the most important information necessary to retain the richness of the original analog recording. One of the major reasons for the effect is that fact that most psychoacoustic models are created and tested using static, non-organic sounds such as steady sinusoidal tones. The tones are produced at varying amplitudes and frequencies to determine the clinical ranges of human audio perception.

Models, however, do not incorporate the complex and often unpredictable response of the ear to complex changing stimuli such as musical recordings which incorporate the perception of several layers of harmonics. The resulting digital signals are often described as being technically precise, but lacking in perceptual depth.

The present invention is designed to enhance a pre-produced digital audio signal to produce a more musically convincing product for the listener. The digital damage done to the audio signal in the form of quantization noise, and the information lost during the original recording encoding cannot be directly recovered during the decoding process. It is therefore necessary to create a set of processing techniques and algorithms that will work in conjunction with previously established decoding standards to produce a new enhanced output signal.

The DSP implementation, as shown in FIG. 1, involves the use a harmonic analyzer to examine the existing encoded data. In order to minimize the amount of digital noise from further data conversions, the encoded data is reevaluated after the audio stream has passed through the demultiplexing and error checking processes of the decoder. The subbands of digital data are windowed and scaled at values appropriate for the harmonic analysis. A filterbank is applied to the newly reconstructed bands of data, and an enhanced audio signal is created.

Figure 2:
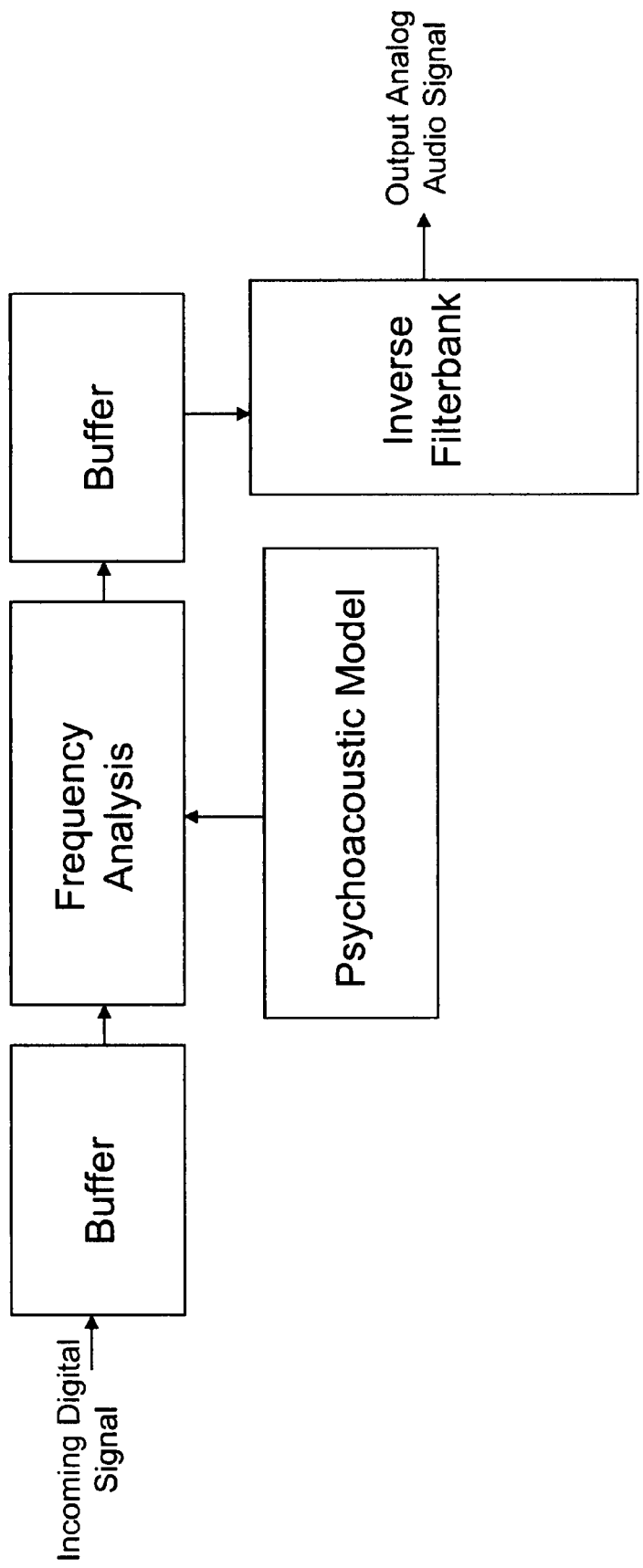
FIG. 2 shows a block diagram of the memory elements of proposed harmonic enhancement process.

The Psychoacoustic analyzer dynamically examines the decoded sub bands of data with adaptive sample windowing to account for the differences in window size necessary to accurately detect transient audio information and frequency dependent audio information. A buffer, as shown in FIG. 2, is used to store sequential window information for dynamic analysis. In each sample window, the fundamental frequency of the incoming signal is determined and a series of supplementary signals is created at multiples of the detected fundamental frequency. The supplementary signals have decreasingly large amplitudes as they are created. The original signal and the artificially created harmonic implements are merged together and placed in a buffer for distribution to inverse filterbanks for the final creation of the analog output signal.

The psychoacoustic model used in the harmonic analysis is designed based upon the responsiveness of the human ear to harmonic stimulation. For the sake of audio reproduction, the preferred embodiment of the new psychoacoustic model is to use musical influences as the test and effectiveness criteria for the design. In this psychoacoustic model instead of using static, non-organic sounds such as steady sinusoidal tones, the complexity of musical influences are used and would incorporate several layers of harmonics.

The invention claimed is:

1. A method for dynamically adjusting the spectral content of an audio signal, which increases the harmonic content of said audio signal, said method comprising translating an encoded digital signal into data bands, creating a psychoacoustic model to identify sections of said data bands that are deficient in harmonic quality, analyzing the fundamental frequency and amplitude of said harmonically deficient data bands, creating additional higher order harmonics for said harmonically deficient data bands, adding said higher order harmonics back to said encoded digital signal to form a newly enhanced signal, inverse filtering said newly enhanced signal, and converting said inverse filtered signal to an analog waveform for consumption by the listener.

2. The method of claim 1 wherein said psychoacoustic model incorporates several layers of harmonics to identify said deficient data bands.

* * * * *